(12) United States Patent
Chen et al.

(10) Patent No.: US 9,425,796 B2
(45) Date of Patent: Aug. 23, 2016

(54) DATA CONVERTING DEVICE, DIGITAL TRANSMITTING APPARATUS USING THE DATA CONVERTING DEVICE, AND RELATED DATA CONVERTING METHOD

(71) Applicant: MEDIATEK INC., Hsin-Chu (TW)

(72) Inventors: Yang-Chuan Chen, Chiayi County (TW); Chih-Jung Chen, Hsinchu (TW); Hsiang-Hui Chang, Miaoli County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/272,522

(22) Filed: May 8, 2014

(65) Prior Publication Data

US 2014/0348269 A1    Nov. 27, 2014

Related U.S. Application Data

(60) Provisional application No. 61/825,630, filed on May 21, 2013.

(51) Int. Cl.
| | |
|---|---|
| *H04L 27/00* | (2006.01) |
| *H03K 19/0175* | (2006.01) |
| *H03F 3/217* | (2006.01) |
| *H04L 27/34* | (2006.01) |
| *H04B 1/04* | (2006.01) |
| *H04W 24/02* | (2009.01) |
| *H04L 25/02* | (2006.01) |
| *H04L 25/08* | (2006.01) |
| *H03M 1/12* | (2006.01) |
| *H04L 7/00* | (2006.01) |
| *G01R 21/06* | (2006.01) |
| *G01R 23/00* | (2006.01) |
| *H03F 1/24* | (2006.01) |
| *H04L 27/20* | (2006.01) |

(52) U.S. Cl.
CPC ....... *H03K 19/017509* (2013.01); *G01R 21/06* (2013.01); *G01R 23/00* (2013.01); *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01); *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

(58) Field of Classification Search
CPC ....... G01R 21/06; G01R 23/00; H03M 1/12; H04B 1/04; H04B 1/0475; H04B 2001/045; H04L 25/028; H04L 25/08; H04L 7/0091
USPC .......... 375/146, 295; 455/91, 333; 341/155, 341/118
See application file for complete search history.

(56) References Cited

U.S. PATENT DOCUMENTS

| | | | |
|---|---|---|---|
| 7,463,869 B2 | 12/2008 | Hung | |
| 2010/0027711 A1* | 2/2010 | Manku | H03M 1/68 375/295 |
| 2012/0201338 A1* | 8/2012 | Leung et al. | 375/376 |

*Primary Examiner* — Leila Malek
(74) *Attorney, Agent, or Firm* — Winston Hsu; Scott Margo

(57) ABSTRACT

A data converting device includes: a data sampling circuit arranged to up-sample a digital signal to generate an up-sampling signal according to a clock signal; a voltage level generating circuit arranged to generate an adjustable voltage; and a signal converting circuit arranged to generate a converting signal according to the adjustable voltage and the up-sampling signal.

19 Claims, 7 Drawing Sheets

DATA CONVERTING DEVICE, DIGITAL TRANSMITTING APPARATUS USING THE DATA CONVERTING DEVICE, AND RELATED DATA CONVERTING METHOD

CROSS REFERENCE TO RELATED APPLICATIONS

This application claims the benefit of U.S. Provisional Application No. 61/825,630, which was filed on May 21, 2013 and is included herein by reference.

BACKGROUND

The present invention relates to a data converting device, a digital transmitting apparatus, and method thereof, and more particularly to a digital transmitting apparatus having large dynamic power range, and the related method.

In wireless communication system, such as the third generation (3G) mobile communication system, a high dynamic range of power is required. For example, a cellular may be required to output power with dynamic range of 78 dB. Normally, an on-chip transmitter capable of generating power range from 0 dBm to −78 dBm may comprise various components, such as digital-to-analog converter (DAC), low pass filter, programmable gain amplifier, modulator, and pre-driver, and those components are complicated and may occupy a large area of the transmitter. Therefore, replacing the transmitter by an RF power DAC, such as a digital transmitter using switch-mode power amplifier, may relax the hardware complexity. However, the dynamic range of the digital transmitter is limited by the minimum size of the semiconductor process. For example, the lowest power generated by one switch-mode power amplifier with the minimum size may only be −45 dBm, which is far higher than the required −78 dBm. Therefore, how to generate a small level of power by a switch-mode power amplifier to extend the dynamic range of a digital transmitter is an urgent problem in the wireless communication system.

SUMMARY

One objective of the present embodiment is to provide a digital transmitting apparatus having large dynamic power range, and the related method.

According to a first embodiment of the present invention, a data converting device is disclosed. The data converting device comprises a data sampling circuit, a voltage level generating circuit, and a signal converting circuit. The data sampling circuit is arranged to up-sample a digital signal to generate an up-sampling signal according to a clock signal. The voltage level generating circuit is arranged to generate an adjustable voltage. The signal converting circuit is arranged to generate a converting signal according to the adjustable voltage and the up-sampling signal.

According to a second embodiment of the present invention, a digital transmitting apparatus is disclosed. The digital transmitting apparatus comprises a plurality of first data converting devices, a plurality of second data converting devices, and a loading circuit. The plurality of first data converting devices are arranged to generate a plurality of first converting signals according to a plurality of first digital signals respectively. The plurality of second data converting devices are arranged to generate a plurality of second converting signals according to a plurality of second digital signals respectively, and at least one of the plurality of second data converting devices comprises: a data sampling circuit arranged to up-sample a second digital signal to generate an up-sampling signal according to a clock signal; a voltage level generating circuit arranged to generate an adjustable voltage; and a signal converting circuit arranged to generate a second converting signal according to the adjustable voltage and the up-sampling signal. The loading circuit is arranged to generate an output signal according to the plurality of first converting signals and the plurality of second converting signals; wherein the plurality of second digital signals are less significant than the plurality of first digital signals.

According to a third embodiment of the present invention, a data converting method is disclosed. The data converting method comprises the steps: up-sampling a digital signal to generate an up-sampling signal according to a clock signal; generating an adjustable voltage; and generating a converting signal according to the adjustable voltage and the up-sampling signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
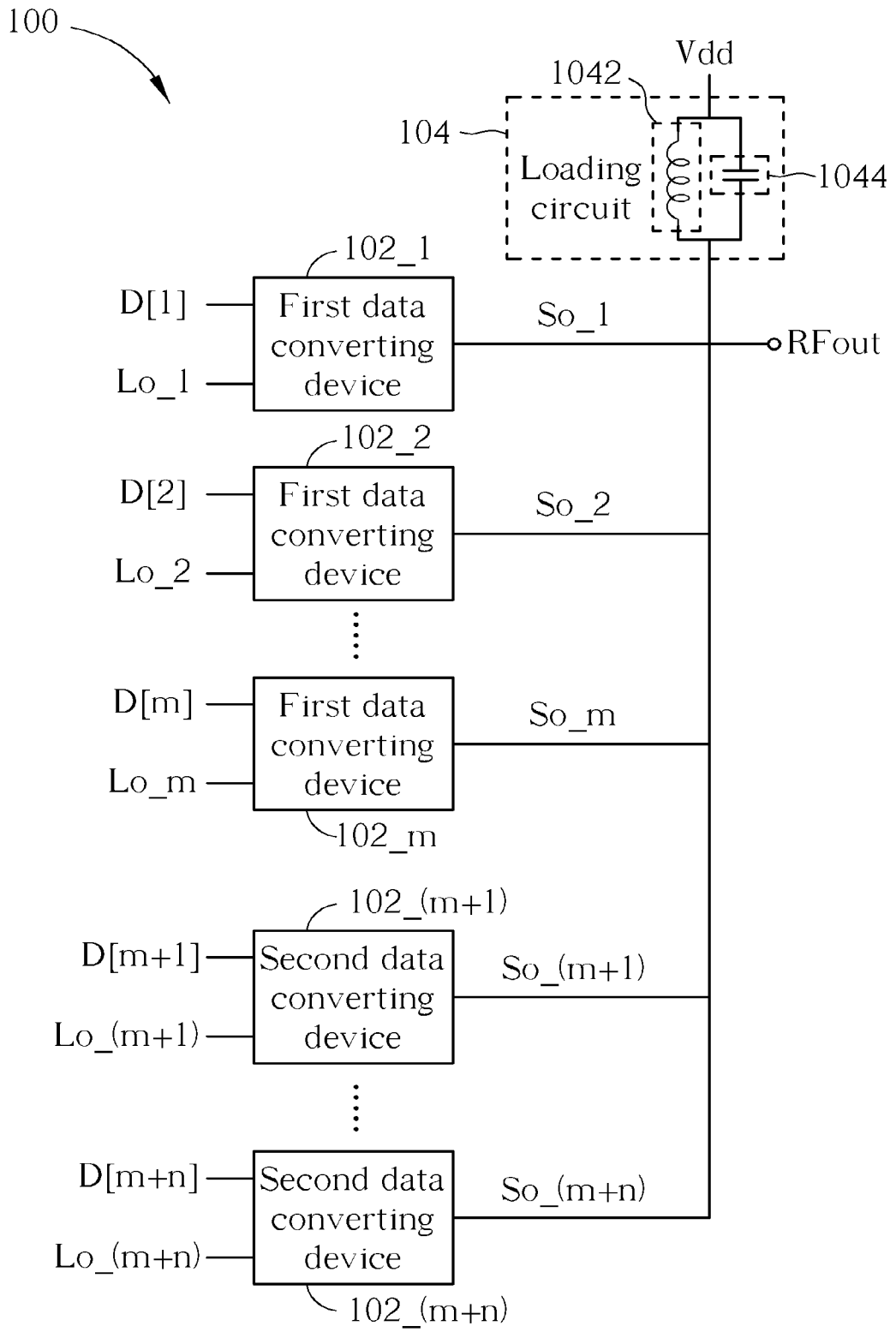
FIG. 1 is a diagram illustrating a digital transmitting apparatus according to an embodiment of the present invention.

Please refer to FIG. 1, which is a diagram illustrating a digital transmitting apparatus 100 according to an embodiment of the present invention. The digital transmitting apparatus 100 is arranged to directly up-convert a plurality of digital signal D[1]~D[m+n] into an RF signal (i.e. the output signal RFout in below paragraph). The digital transmitting apparatus 100 comprises a plurality of first data converting devices 102_1~102_m, a plurality of second data converting devices 102_(m+1)~102_(m+n), and a loading circuit 104. The plurality of first data converting devices 102_1~102_m are arranged to generate a plurality of first converting signals So_1~So_m according to a plurality of first digital signals D[1]~D[m] respectively. The plurality of second data converting devices 102_(m+1)~102_(m+n) are arranged to generate a plurality of second converting signals So_(m+1)~So_(m+n) according to a plurality of second digital signals D[m+1]~D[m+n] respectively. The loading circuit 104 is arranged to generate an output signal RFout according to the plurality of first converting signals So_1~So_m and the plurality of second converting signals So_(m+1)~So_(m+n). It is noted that m and n can be any positive integer number.

In this embodiment, the plurality of second digital signals D[m+1]~D[m+n] are less significant than the plurality of first digital signals D[1]~D[m]. In other words, the first digital signal D[1] is the most significant bit, and the second digital signal D[m+n] is the least significant bit.

More specifically, the plurality of first data converting devices 102_1~102_m use a plurality of first clock signal Lo_1~Lo_m to up-sample/up-convert the plurality of first digital signals D[1]~D[m] to generate the plurality of first converting signals So_1~So_m respectively. The plurality of second converting signals So_(m+1)~So_(m+n) also uses a plurality of second clock signal Lo_(m+1)~Lo_(m+n) to up-sample/up-convert the plurality of second digital signals D[m+1]~D[m+n] to generate the plurality of second converting signals So_(m+1)~So_(m+n) respectively. In this embodiment, the plurality of first clock signal Lo_1~Lo_m and the plurality of second clock signal Lo_(m+1)~Lo_(m+n) are the same clock signal.

According to this embodiment, it is assumed that the power levels of the plurality of second converting signals So_(m+1)~So_(m+n) generated by the plurality of second data converting devices 102_(m+1)~102_(m+n) respectively are lower than a specific power level. The specific power level is the power level corresponding to the first data converting device 102_m that receives the first digital signals D[m]. It is noted that, the first digital signals D[m] is the least significant bit among the plurality of first digital signals D[1]~D[m]. More specifically, please refer to FIG. 2, which is a diagram illustrating the first data converting device 102_m according to an embodiment of the present invention. The first data converting device 102_m comprises a data sampling circuit 102_m_1, a first field-effected transistor 102_m_2, and a second field-effected transistor 102_m_3. The first field-effected transistor 102_m_2 is cascoded to the second field-effected transistor 102_m_3. Both the first field-effected transistor 102_m_2 and the second field-effected transistor 102_m_3 have the smallest aspect ratio, i.e. W/L, corresponding to the semiconductor process. The data sampling circuit 102_m_1 is arranged to up-sample the first digital signals D[m] to generate an up-sampling signal Su_m according to the first clock signal Lo_m. The first field-effected transistor 102_m_2 receives the up-sampling signal Su_m. The second field-effected transistor 102_m_3, which is controlled by a tuning voltage Vt, generates the first converting signal So_m. Please note that the second field-effected transistor 102_m_3 is an optional isolation device to the present invention. It can be controlled by either Vt or Vdd depending on design needs.

Figure 2:
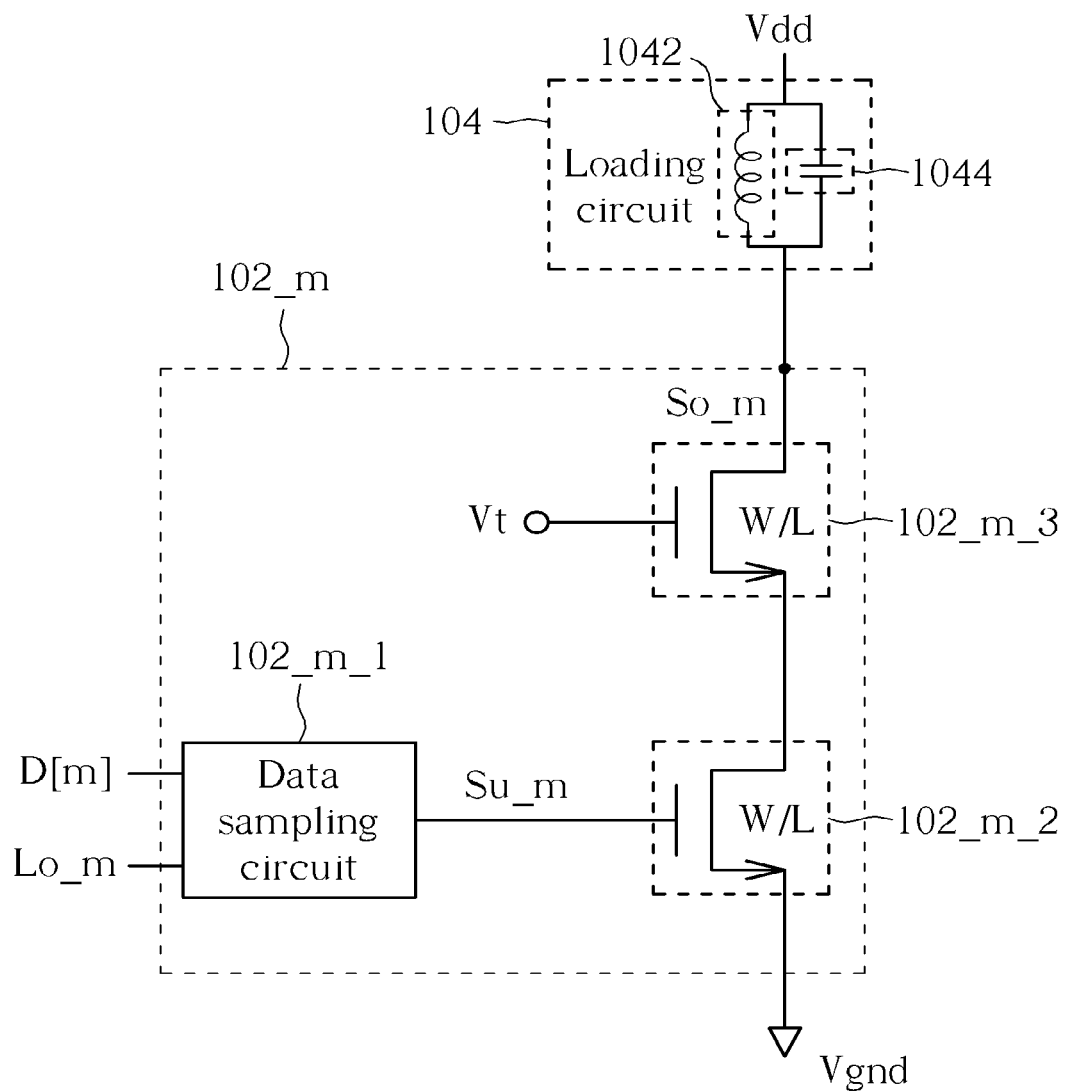
FIG. 2 is a diagram illustrating a first data converting device according to an embodiment of the present invention.

It can be seen that, by using the cascoded configuration as shown in FIG. 2, the power level of the first converting signal So_m is the lowest power level because both the first field-effected transistor 102_m_2 and the second field-effected transistor 102_m_3 are the smallest aspect ratio, i.e. W/L. For example, the power level of the first converting signal So_m is substantially −45 dBm.

Accordingly, to extend the dynamic range of the digital transmitting apparatus 100 to lower than the power level of the first converting signal So_m, the plurality of second data converting devices 102_(m+1)~102_(m+n) are presented. In this embodiment, the power levels of the plurality of second data converting devices 102_(m+1)~102_(m+n) are smaller than the power level of the first converting signal So_m, and the power levels of the plurality of second data converting devices 102_(m+1)~102_(m+n) decrease in orderly. In other words, the second data converting device 102_(m+n) has the smallest power level. For example, the power level of the second data converting device 102_(m+n) may be ~−78 dBm.

Figure 3:
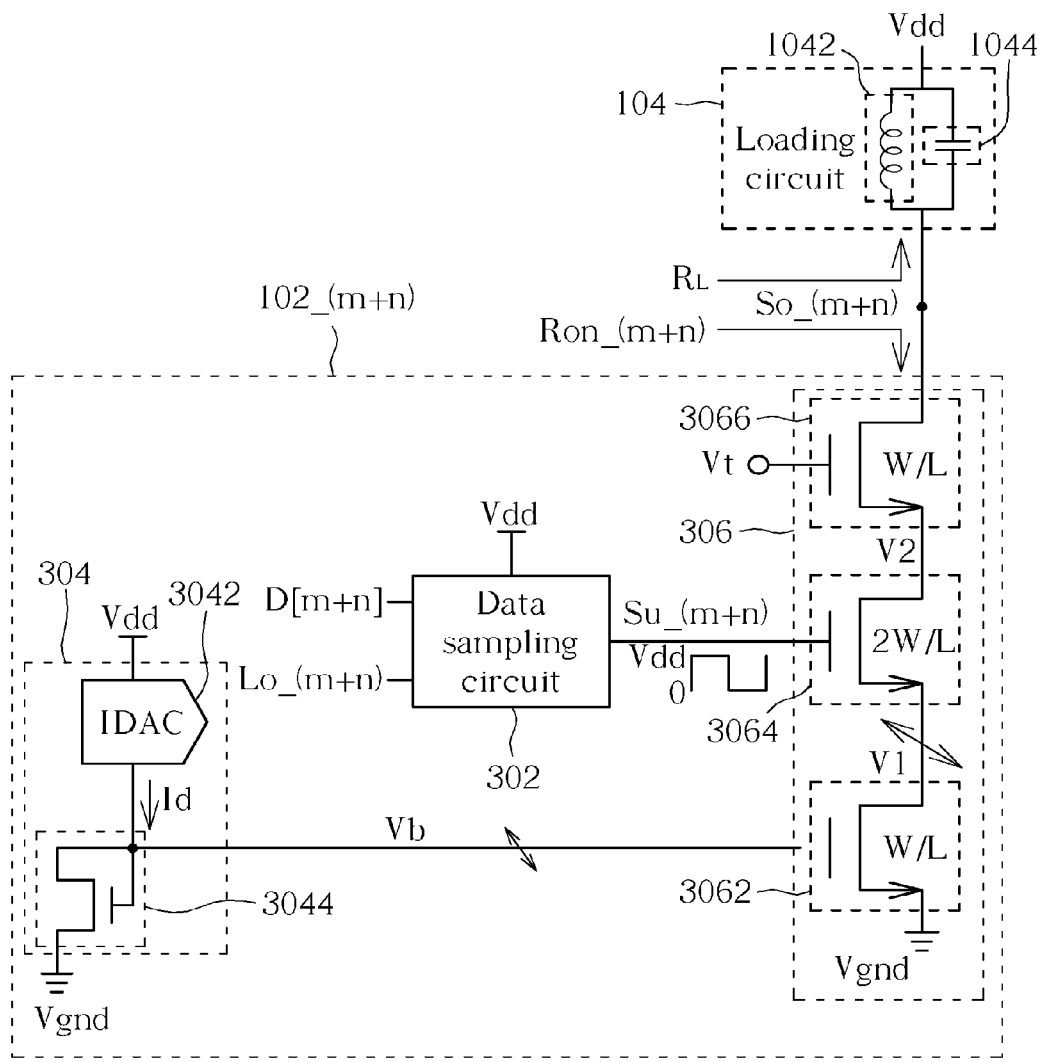
FIG. 3 is a diagram illustrating one of the plurality of second data converting devices according to an embodiment of the present invention.

Please refer to FIG. 3, which is a diagram illustrating one (e.g. the second data converting device 102_(m+n)) of the plurality of second data converting devices 102_(m+1)~102_(m+n) according to an embodiment of the present invention. The second data converting device 102_(m+n) comprises a data sampling circuit 302, a voltage level generating circuit 304, and a signal converting circuit 306. The loading circuit 104 is also shown in FIG. 3. The data sampling circuit 302 is a digital quadrature converter (DQC), and is arranged to up-sample the second digital signal D[m+n] to generate an up-sampling signal Su_(m+n) according to a clock signal Lo_(m+n). The voltage level generating circuit 304 is arranged to generate an adjustable voltage Vb. The signal converting circuit 306 is arranged to generate the second converting signal So_(m+n) according to the adjustable voltage Vb and the up-sampling signal Su_(m+n). The loading circuit 104 is arranged to receive the second converting signal So_(m+n).

The voltage level generating circuit 304 comprises a current-based digital-to-analog converter (IDAC) 3042 and a field-effected transistor 3044. The current-based digital-to-analog converter 3042 is arranged to generate a current $I_d$. The field-effected transistor 3044 is arranged to generate the adjustable voltage Vb according to the current $I_d$. The field-effected transistor 3044 is a diode-connected transistor, in which the drain terminal is connected to the gate terminal, and the adjustable voltage Vb is outputted from the common gate of the drain terminal and the gate terminal. The field-effected transistor 3044 may be an N-type field-effected transistor.

The signal converting circuit 306 comprises a first field-effected transistor 3062, a second field-effected transistor 3064, and a third field-effected transistor 3066. The first field-effected transistor 3062 has a gate terminal receiving the adjustable voltage Vb, a first connecting terminal (e.g. source terminal) connecting to ground voltage Vgnd, and a second connecting terminal (e.g. drain terminal) outputting a first voltage V1 according to the adjustable voltage Vb. The second field-effected transistor 3064 has a gate terminal receiving the up-sampling signal Su_(m+n), a first connecting terminal (e.g. source terminal) receiving the first voltage V1, and a second connecting terminal (e.g. drain terminal) outputting a second voltage V2. The third field-effected transistor 3066 has a gate terminal receiving a tuning voltage Vt, a first connecting terminal (e.g. source terminal) receiving the second voltage V2, and a second connecting terminal (e.g. drain terminal) outputting the converting signal So_(m+n). In this embodiment, the field-effected transistors 3062, 3064, and 3066 may be N-type field-effected transistors. Please note that the third field-effected transistor 3066 is an optional isolation device to the present invention. It can be controlled by either Vt or Vdd depending on design needs. The field-effected transistors 3062 and 3066 have the smallest aspect ratio, i.e. W/L, while the aspect ratio of the field-effected transistor 3064 is 2*W/L. However, it should be noted that the size of each transistor is just exemplary and is not a limitation to the present invention.

In addition, the loading circuit 104 is coupled to a supply voltage (i.e. Vdd), and the loading circuit may comprise an inductor 1042 and a capacitor 1044. The inductor 1042 connects to the capacitor 1044 in parallel as shown in FIG. 3.

According to the embodiment, the adjustable voltage Vb of the second data converting device 102_(m+n) is a predetermined voltage. However, the other second data converting devices may have different adjustable voltages respectively. In other words, depending on the output power levels of the plurality of second data converting devices 102_(m+1)~102_(m+n), the plurality of second data converting devices 102_(m+1)~102_(m+n) have their own adjustable voltage Vb. In this embodiment, the adjustable voltages of the plurality of second data converting devices 102_(m+1)~102_(m+n) decrease orderly from the second data converting device 102_(m+1) to the second data converting device 102_(m+n) because the power levels of the plurality of second data converting devices 102_(m+1)~102_(m+n) are designed to reduce orderly from the second data converting device 102_(m+1) to the second data converting device 102_(m+n) respectively.

Simply speaking, the adjustable voltage Vb affects the first voltage V1, the first voltage V1 affects the voltage drop (i.e. Vgs) between the gate terminal and the source terminal of the second field-effected transistor 3064, the voltage drop Vgs affects the output resistance (i.e. $R_{on\_(m+n)}$) of the second data converting device 102_(m+n), and the output resistance $R_{on\_(m+n)}$ affects the output power of the second data converting device 102_(m+n). Therefore, the adjustable voltage Vb decides the power level of the second data converting device 102_(m+n). For example, when the adjustable voltage Vb decreases, the first voltage V1 will increase to reduce the voltage drop Vgs, and then the output resistance $R_{on\_(m+n)}$ will increase to reduce the output power of the second data converting device 102_(m+n). It should be noted that the up-sampling signal Su_(m+n) is a clock signal having high voltage level of Vdd (i.e. supply voltage) and low voltage level of Vgnd (i.e. ground voltage).

Figure 4:
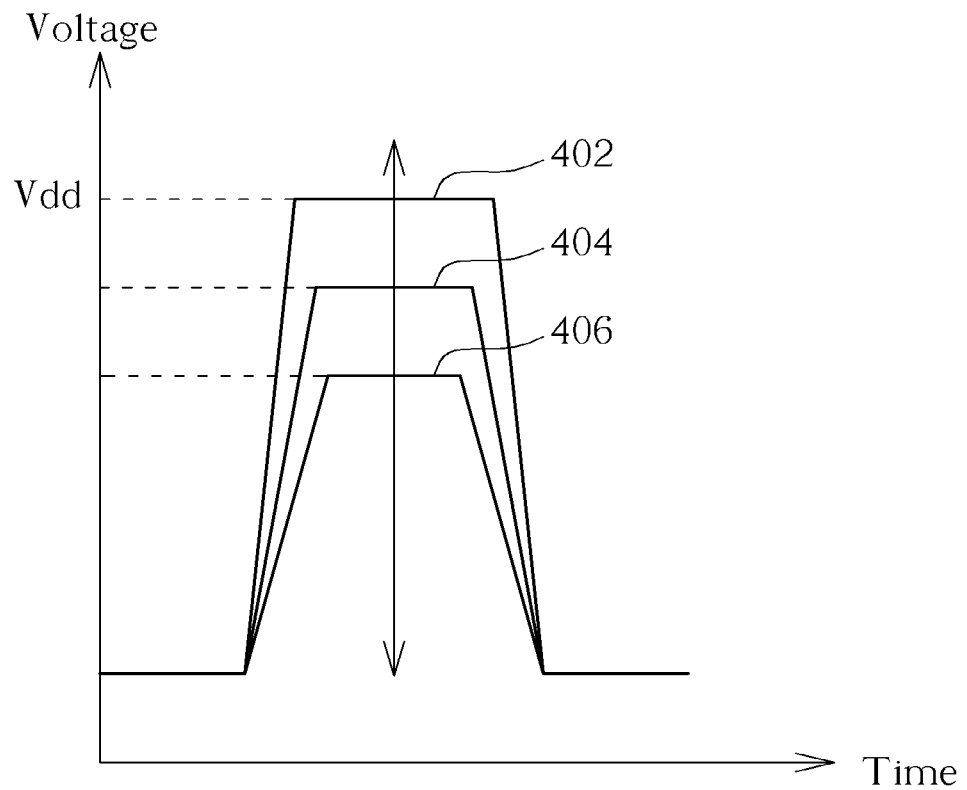
FIG. 4 is a timing diagram illustrating various voltage drops of the second field-effected transistor corresponding to different adjustable voltages according to an embodiment of the present invention.

Please refer to FIG. 4, which is a timing diagram illustrating various voltage drops Vgs of the second field-effected transistor 3064 corresponding to different adjustable voltages Vb according to an embodiment of the present invention. The voltage drop Vgs is a clock signal having high voltage level depending on the adjustable voltage Vb and low voltage level of ground. Therefore, when the adjustable voltage Vb is the supply voltage Vdd, the high voltage level of the voltage drop Vgs is also Vdd, i.e. the curve 402. When the adjustable voltage Vb is low than the supply voltage Vdd, the high voltage level of the voltage drop Vgs is also lower than Vdd, e.g. the curves 404 or 406. In other words, the adjustable voltage Vb is proportional to the high voltage level of the voltage drop Vgs. Accordingly, by providing different adjustable voltages Vb to the plurality of second data converting devices 102_(m+1)~102_(m+n), the plurality of second data converting devices 102_(m+1)~102_(m+n) can generate the plurality of second converting signal So_(m+1)~So_(m+n) with different power levels respectively.

Moreover, the plurality of second data converting devices 102_(m+1)~102_(m+n) are also insensitive to the temperature variation. Take the second data converting devices 102_(m+n) and 102_(m+n−1) as an example, the extension of the power level of the second data converting devices 102_(m+n) and 102_(m+n−1) is illustrated by the following equations (1)~(7):

$$P \propto I^2 \frac{R_L}{R_L + R_{eq}} \quad (1)$$

$$\frac{1}{R_{eq}} = \frac{1}{R_{on\_1}} + \frac{1}{R_{on\_2}} + \ldots + \frac{1}{R_{on\_m}} + \frac{1}{R_{on\_(m+1)}} + \ldots \frac{1}{R_{on\_(m+n)}} \quad (2)$$

$$Vb = \sqrt{\frac{I_d}{k\left(\frac{W}{L}\right)_{vb}}} + V_{th\_b} \quad (3)$$

$$R_{on\_M0\_(m+n)} = \frac{1}{k\left(\frac{W}{L}\right)_{M0}(V_{g0} - V_{th0})} = \frac{1}{k\left(\frac{W}{L}\right)_{M0}\left(\sqrt{\frac{I_d}{k\left(\frac{W}{L}\right)_{vb}}}\right)} \quad (4)$$

$$R_{on\_M1\_(m+n)} = \frac{1}{k\left(\frac{W}{L}\right)_{M1}(V_{dd} - I_d R_{on\_M0\_(m+n)} - V_{th1})} \quad (5)$$

$$R_{on\_M1\_(m+n-1)} = \frac{1}{k\left(\frac{W}{L}\right)_{M1}(V_{dd} - I_{d'} R_{on\_M0\_(m+n)} - V_{th1})} \quad (6)$$

$$\frac{(5)}{(6)} = \frac{(V_{dd} - I_{d'} R_{on\_M0\_(m+n)} - V_{th1})}{(V_{dd} - I_d R_{on\_M0\_(m+n)} - V_{th1})} \quad (7)$$

Please refer to FIG. 1~FIG. 3. $R_L$ is the loading resistance of loading circuit 104. The output power P of the output signal RFout is inversely proportional to the equivalent output resistance Req of the plurality of first data converting devices 102_1~102_m and the plurality of second data converting devices 102_(m+1)~102_(m+n), in which $R_{on\_1}$ is the output resistance of data converting devices 102_1, $R_{on\_2}$ is the output resistance of data converting devices 102_2, and so on. $I_d$ is the current flowing through the field-effected transistor 3044. $(W/L)_{vb}$ is the aspect ratio of the field-effected transistor 3044. $V_{th\_b}$ is the threshold voltage of the field-effected transistor 3044. $R_{on\_m0\_(m+n)}$ is the turn-on resistance of the first field-effected transistor 3062. $(W/L)_{M0}$ is the aspect ratio of the first field-effected transistor 3062. $V_{g0}$ is Vb. $V_{th0}$ is the threshold voltage of the first field-effected transistor 3062. $R_{on\_M1\_(m+n)}$ is the turn-on resistance of the second field-effected transistor 3064. $(W/L)_{M1}$ is the aspect ratio of the second field-effected transistor 3064. $V_{th1}$ is the threshold voltage of the second field-effected transistor 3064. The second data converting device 102_(m+n−1) is assumed to have the similar characteristic to the second data converting device 102_(m+n) except for the $I_d'$ and $R_{on\_M1\_(m+n-1)}$. $I_d'$ is the current flowing through the diode-connected field-effected transistor (i.e. the field-effected transistor with the same position to the field-effected transistor 3044 in the second data converting device 102_(m+n)) in the second data converting device 102_(m+n−1). $R_{on\_M1\_(m+n-1)}$ is the turn-on resistance of the second field-effected transistor (i.e. the field-effected transistor with the same position to the second field-effected transistor 3064 in the second data converting device 102_($m$+n)) in the second data converting device 102_($m$+n−1).

According to the above equations (5) and (6), the $R_{on\_M1\_(m+n)}$ is only depended on the currents $I_d$, and the $R_{on\_M1\_(m+n-1)}$ is only depended on the currents $I_d'$. As the temperature variation may cause the currents $I_d$ and $I_d'$ to have the similar trend of variation, the ratio of the $R_{on\_M1\_(m+n)}$ over the $R_{on\_M1\_(m+n-1)}$ can be kept substantially intact when the temperature varies (i.e. equation (7)). Therefore, the power level difference between the second data converting devices 102_($m$+n) and 102_($m$+n−1) can be kept substantially intact when the temperature varies. In other words, the bit-to-bit variation between the second data converting devices 102_($m$+n) and 102_($m$+n−1) is insensitive to the temperature variation.

Accordingly, the plurality of second data converting devices 102_($m$+1)~102_($m$+n) are insensitive to the temperature variation, and the bit-to-bit temperature variations of the plurality of second digital signals D[m+1]~D[m+n] are minimized.

According to the embodiment, the well temperature tracking between the LSBs resulted from tracked threshold voltage (i.e. Vb) minimized bit-to-bit temperature variation. In addition, the mismatches between the current-based DACs in the plurality of second data converting devices 102_($m$+1)~102_($m$+n) are removed by inside cell mismatch calibration.

Figure 5:
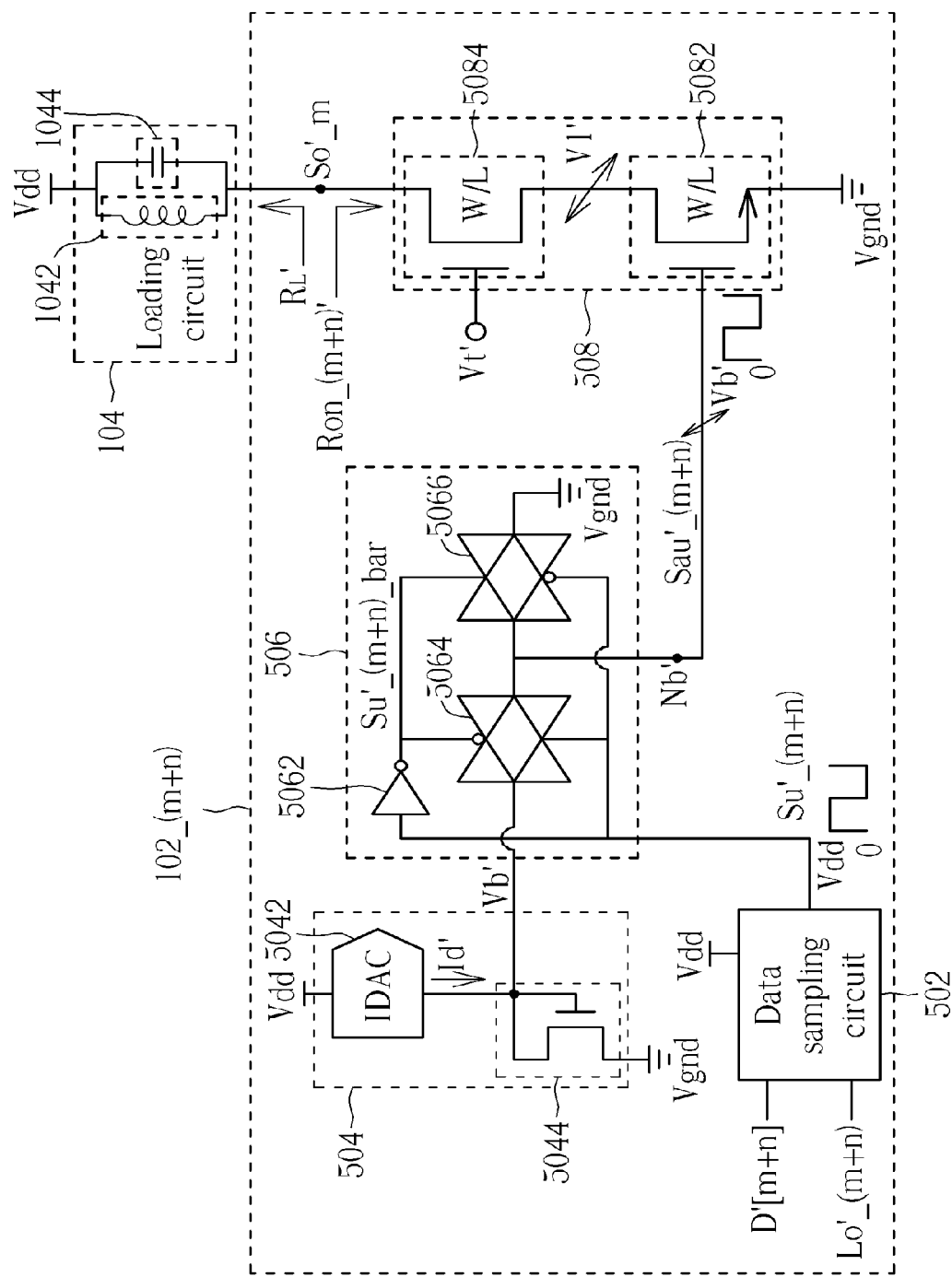
FIG. 5 is a diagram illustrating one of the plurality of second data converting devices according to another embodiment of the present invention.

Please refer to FIG. 5, which is a diagram illustrating one (e.g. the second data converting device 102_($m$+n)) of the plurality of second data converting devices 102_($m$+1)~102_($m$+n) according to another embodiment of the present invention. The second data converting device 102_($m$+n) comprises a data sampling circuit 502, a voltage level generating circuit 504, an adjusting circuit 506, and a signal converting circuit 508. The loading circuit 104 is also shown in FIG. 5. The data sampling circuit 502 is a digital quadrature converter (DQC), and is arranged to up-sample the second digital signal D'[m+n] to generate an up-sampling signal Su'_(m+n) according to a clock signal Lo'_(m+n). The voltage level generating circuit 504 is arranged to generate an adjustable voltage Vb'. The adjusting circuit 506 is arranged to adjust a voltage level of the up-sampling signal Su'_(m+n) to generate an adjusted up-sampling signal Sau'_(m+n) according to the adjustable voltage Vb'. The signal converting circuit 508 is arranged to generate the second converting signal So'_(m+n) according to the adjusted up-sampling signal Sau'_(m+n). The loading circuit 104 is arranged to receive the second converting signal So'_(m+n).

The voltage level generating circuit 504 comprises a current-based digital-to-analog converter 5042 and a field-effected transistor 5044. The current-based digital-to-analog converter 5042 is arranged to generate a current $I_d'$. The field-effected transistor 3044 is arranged to generate the adjustable voltage Vb' according to the current $I_d'$. The field-effected transistor 3044 is a diode-connected transistor, in which the drain terminal is connected to the gate terminal, and the adjustable voltage Vb' is outputted from the common gate of the drain terminal and the gate terminal. The field-effected transistor 5044 may be an N-type field-effected transistor.

The adjusting circuit 506 comprises an inverter 5062, a first pass gate 5064, and a second pass gate 5066. The inverter 5062 is arranged to inverse the up-sampling signal Su'_(m+n) to generate an inverse up-sampling signal Su'_(m+n)_bar. The first pass gate 5064 is arranged to output the adjustable voltage Vb' to an output terminal Nb' when the up-sampling signal Su'_(m+n) is a first voltage level, e.g. the supply voltage Vdd. The second pass gate 5066 is arranged to output a reference voltage, e.g. the ground voltage Vgnd, to the output terminal Nb' when the up-sampling signal Su'_(m+n) is a second voltage level, e.g. the ground voltage Vgnd, different from the first voltage level. In this embodiment, a signal on the output terminal Nb' is the adjusted up-sampling signal Sau'_(m+n). More specifically, the first pass gate 5064 is turned on only when the voltage level of the up-sampling signal Su'_(m+n) is the supply voltage Vdd, and the second pass gate 5066 is turned on only when the voltage level of the up-sampling signal Su'_(m+n) is the ground voltage Vgnd. Accordingly, the adjusted up-sampling signal Sau'_(m+n) is aligned and has the same duty cycle to the up-sampling signal Su'_(m+n). The only difference is the high voltage level of the adjusted up-sampling signal Sau'_(m+n) is the adjustable voltage Vb' and the high voltage level of the up-sampling signal Su'_(m+n) is the supply voltage Vdd.

The signal converting circuit 508 comprises a first field-effected transistor 5082 and a second field-effected transistor 5084. The first field-effected transistor 5062 has a gate terminal receiving the adjusted up-sampling signal Sau'_(m+n), a first connecting terminal (e.g. source terminal) connecting to ground voltage Vgnd, and a second connecting terminal (e.g. drain terminal) outputting a first voltage V1' according to the adjusted up-sampling signal Sau'_(m+n). The second field-effected transistor 5084 has a gate terminal receiving a tuning voltage Vt', a first connecting terminal (e.g. source terminal) receiving the first voltage V1', and a second connecting terminal (e.g. drain terminal) outputting the converting signal So'_(m+n). In this embodiment, the field-effected transistors 5082 and 5084 may be N-type field-effected transistors. The field-effected transistors 5082 and 5084 have the smallest aspect ratio, i.e. W/L.

Similar to the embodiment as shown in FIG. 3, the adjustable voltage Vb' of the second data converting device 102_($m$+n) is a predetermined voltage. However, the other second data converting devices may have different adjustable voltages respectively. In other words, depending on the output power levels of the plurality of second data converting devices 102_($m$+1)~102_($m$+n), the plurality of second data converting devices 102_($m$+1)~102_($m$+n) have their own adjustable voltage Vb'. In this embodiment, the adjustable voltages of the plurality of second data converting devices 102_($m$+1)~102_($m$+n) decrease orderly from the second data converting device 102_($m$+1) to the second data converting device 102_($m$+n) because the power levels of the plurality of second data converting devices 102_($m$+1)~102_($m$+n) are designed to reduce orderly from the second data converting device 102_($m$+1) to the second data converting device 102_($m$+n) respectively.

Simply speaking, the adjustable voltage Vb' affects the voltage drop (i.e. Vgs') between the gate terminal and the source terminal of the first field-effected transistor 5082, the voltage drop Vgs' affects the output resistance (i.e. $R_{on\_(m+n)}'$) of the second data converting device 102_($m$+n), and the output resistance $R_{on\_(m+n)}'$ affects the output power of the second data converting device 102_($m$+n). Therefore, the adjustable voltage Vb' decides the power level of the second data converting device 102_($m$+n). For example, when the adjustable voltage Vb' decreases, the voltage drop Vgs' also decreases, and then the output resistance $R_{on\_(m+n)}'$ will increase to reduce the output power of the second data converting device 102_($m$+n).

Similar to the above FIG. 4, the adjustable voltage Vb' is proportional to the high voltage level of the voltage drop Vgs'. Accordingly, by providing different adjustable voltages Vb' to the plurality of second data converting devices 102_(m+1)~102_(m+n), the plurality of second data converting devices 102_(m+1)~102_(m+n) can generate the plurality of second converting signal So'_(m+1)~So'_(m+n) with different power levels respectively.

Similarly, in this embodiment, the plurality of second data converting devices 102_(m+1)~102_(m+n) are also insensitive to the temperature variation. Take the second data converting devices 102_(m+n) and 102_(m+n-1) as an example, the extension of the power level of the second data converting devices 102_(m+n) and 102_(m+n-1) is illustrated by the following equations (8)~(13):

$$P' \propto I'^2 \frac{R_L}{R_L + R'_{eq}} \quad (8)$$

$$\frac{1}{R'_{eq}} = \frac{1}{R'_{on\_1}} + \frac{1}{R'_{on\_2}} + \ldots + \frac{1}{R'_{on\_m}} + \frac{1}{R'_{on\_(m+1)}} + \ldots \frac{1}{R'_{on\_(m+n)}} \quad (9)$$

$$Vb' = \sqrt{\frac{I_{d'}}{k\left(\frac{W}{L}\right)_{vb'}}} + V_{th\_b} \quad (10)$$

$$R'_{on\_M1\_(m+n)} = \frac{1}{k\left(\frac{W}{L}\right)_{M1}(V_{g0} - V_{th0})} = \frac{1}{k\left(\frac{W}{L}\right)_{M1}\left(\sqrt{\frac{I_{d'}}{k\left(\frac{W}{L}\right)_{vb'}}}\right)} \quad (11)$$

$$R'_{on\_M1\_(m+n-1)} = \frac{1}{k\left(\frac{W}{L}\right)_{M1}(V_{g0} - V_{th0})} = \frac{1}{k\left(\frac{W}{L}\right)_{M1}\left(\sqrt{\frac{I_{d''}}{k\left(\frac{W}{L}\right)_{vb'}}}\right)} \quad (12)$$

$$\frac{(11)}{(12)} = \sqrt{\frac{I_{d''}}{I_{d'}}} \quad (13)$$

Please refer to FIG. 1, FIG. 2, and FIG. 5. $R_L$ is the loading resistance of loading circuit 104. The output power P' of the output signal RFout is inversely proportional to the equivalent output resistance Req' of the plurality of first data converting devices 102_1~102_m and the plurality of second data converting devices 102_(m+1)~102_(m+n), in which $R_{on\_1}'$ is the output resistance of data converting devices 102_1, $R_{on\_2}'$ is the output resistance of data converting devices 102_2, and so on. $I_d'$ is the current flowing through the field-effected transistor 5044. (W/L)$_{vb'}$ is the aspect ratio of the field-effected transistor 5044. $V_{th\_b}$ is the threshold voltage of the field-effected transistor 5044. $R_{on\_m1\_(m+n)}'$ is the turn-on resistance of the first field-effected transistor 5082. (W/L)$_{M1}$ is the aspect ratio of the first field-effected transistor 5082. $V_{g0}$ is Vb'. $V_{th0}$ is the threshold voltage of the first field-effected transistor 5082. The second data converting device 102_(m+n-1) is assumed to have the similar characteristic to the second data converting device 102_(m+n) except for the $I_d''$ and $R_{on\_M1\_(m+n-1)}'$. $I_d''$ is the current flowing through the diode-connected field-effected transistor (i.e. the field-effected transistor with the same position to the field-effected transistor 5044 in the second data converting device 102_(m+n)) in the second data converting device 102_(m+n-1). $R_{on\_M1\_(m+n-1)}'$ is the turn-on resistance of the first field-effected transistor (i.e. the field-effected transistor with the same position to the first field-effected transistor 5082 in the second data converting device 102_(m+n)) in the second data converting device 102_(m+n-1).

According to the above equations (11) and (12), the $R_{on\_M1\_(m+n-1)}'$ is only depended on the currents $I_d'$, and the $R_{on\_M1\_(m+n-1)}'$ is only depended on the currents $I_d''$. As the temperature variation may cause the currents $I_d'$ and $I_d''$ to have the similar trend of variation, the ratio of the $R_{on\_M1\_(m+n-1)}'$ over the $R_{on\_M1\_(m+n-1)}'$ can be kept substantially intact when the temperature varies (i.e. equation (13)). Therefore, the power level difference between the second data converting devices 102_(m+n) and 102_(m+n-1) can be kept substantially intact when the temperature varies. In other words, the bit-to-bit variation between the second data converting devices 102_(m+n) and 102_(m+n-1) is insensitive to the temperature variation.

Accordingly, the plurality of second data converting devices 102_(m+1)~102_(m+n) are insensitive to the temperature variation, and the bit-to-bit temperature variations of the plurality of second digital signals D[m+1]~D[m+n] are minimized.

According to the embodiment, the well temperature tracking between the LSBs resulted from tracked threshold voltage (i.e. Vb') minimized bit-to-bit temperature variation. In addition, the mismatches between the current-based DACs in the plurality of second data converting devices 102_(m+1)~102_(m+n) are removed by inside cell mismatch calibration.

Figure 6:
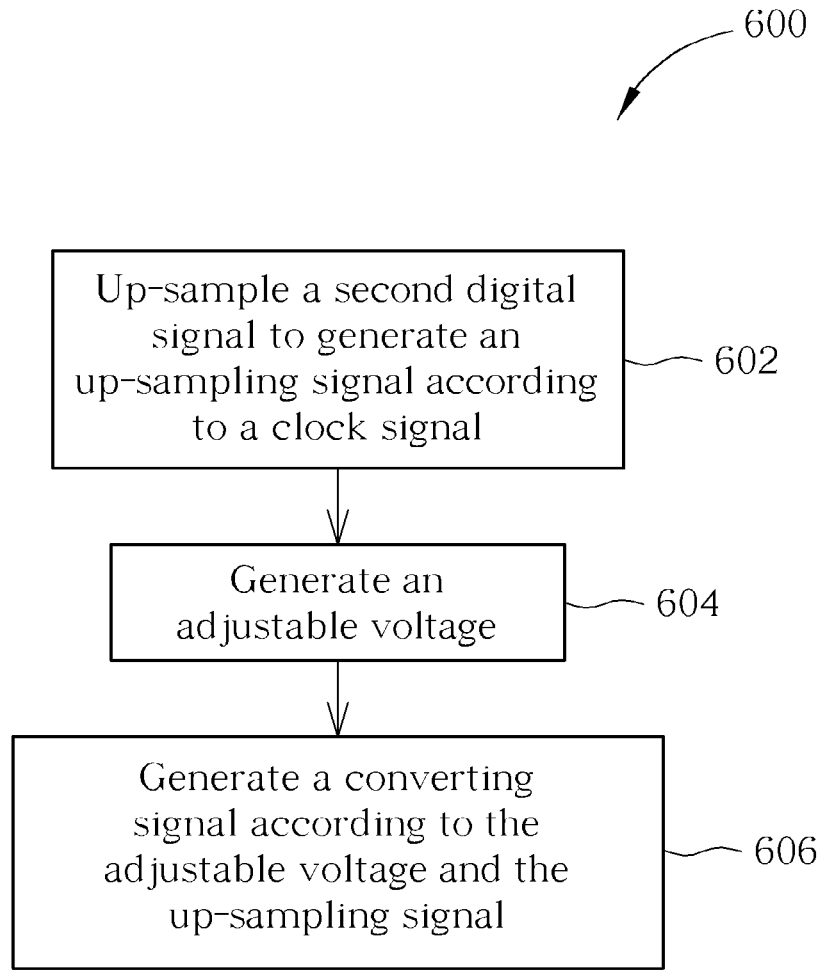
FIG. 6 is a flowchart illustrating a data converting method of the second data converting device according to an embodiment of the present invention.

In summary, the method of the above mentioned second data converting device (i.e. 102_(m+1)~102_(m+n)) as shown in FIG. 3 can be summarized into the steps of FIG. 6. FIG. 6 is a flowchart illustrating a data converting method 600 of the second data converting device 102_(m+n) according to an embodiment of the present invention. Provided that substantially the same result is achieved, the steps of the flowchart shown in FIG. 6 need not be in the exact order shown and need not be contiguous, that is, other steps can be intermediate. The data converting method 600 comprises:

Step 602: Up-sample the second digital signal D[m+n] to generate the up-sampling signal Su_(m+n) according to the clock signal Lo_(m+n);

Step 604: Generate the adjustable voltage Vb; and

Step 606: Generate the converting signal So_(m+n) according to the adjustable voltage Vb and the up-sampling signal Su_(m+n).

Figure 7:
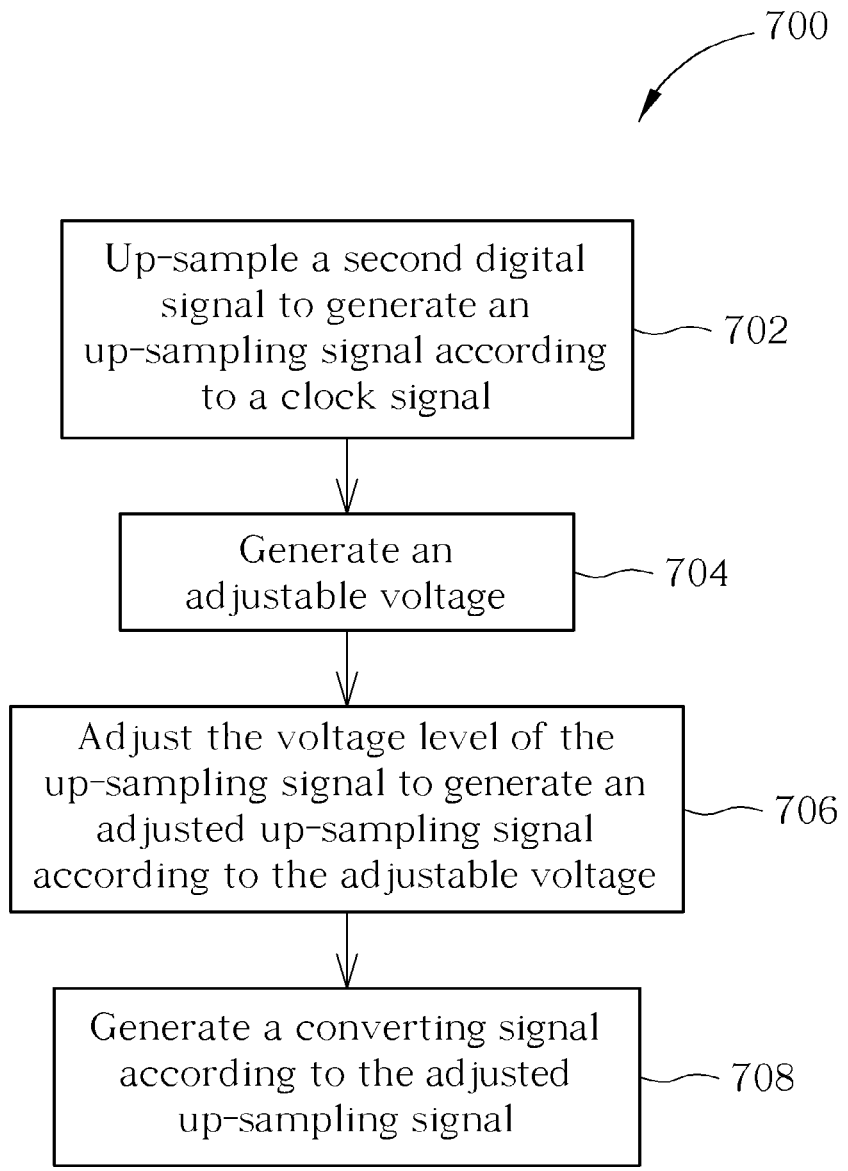
FIG. 7 is a flowchart illustrating a data converting method of the second data converting device according to another embodiment of the present invention.

In addition, the method of the above mentioned second data converting device (i.e. 102_(m+1)~102_(m+n)) of the digital transmitting apparatus 100 as shown in FIG. 5 can be summarized into the steps of FIG. 7. FIG. 7 is a flowchart illustrating a data converting method 700 of the second data converting device 102_(m+n) according to another embodiment of the present invention. Provided that substantially the same result is achieved, the steps of the flowchart shown in FIG. 7 need not be in the exact order shown and need not be contiguous, that is, other steps can be intermediate. The data converting method 700 comprises:

Step 702: Up-sample the second digital signal D'[m+n] to generate the up-sampling signal Su'_(m+n) according to the clock signal Lo'_(m+n);

Step 704: Generate the adjustable voltage Vb';

Step 706: Adjust the voltage level of the up-sampling signal Su'_(m+n) to generate the adjusted up-sampling signal Sau'_(m+n) according to the adjustable voltage Vb';

Step 708: Generate the converting signal So'_(m+n) according to the adjusted up-sampling signal Sau'_(m+n).

Briefly, as illustrated in the above embodiments, the present invention breaks through the semiconductor process limitation to extend the dynamic range of a digital transmitter. The present invention uses the full-code data (i.e. Su_(m+1)~Su_(m+n)) to sample a variable statistic voltage (i.e. Vb) generated by a current based DAC (i.e. 304) to adjust the turning on resistance of the extension bits (i.e. D[m+1]~D[m+n]) into smaller power level which achieves dynamic extension in LSBs. The well temperature tracking between the LSBs resulted from tracked threshold voltage (i.e. Vb) minimized bit-to-bit temperature variation. In addition, the present invention removes the mismatches between the current-based DACs by inside cell mismatch calibration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data converting device, comprising:
   a data sampling circuit, arranged to up-sample a digital signal to generate an up-sampling signal according to a clock signal;
   a voltage level generating circuit, arranged to generate an adjustable voltage; and
   a signal converting circuit, arranged to generate a converting signal according to the adjustable voltage and the up-sampling signal, wherein the signal converting circuit refers the adjustable voltage to control an instant power of the converting signal corresponding to the up-sampling signal.

2. The data converting device of claim 1, wherein the signal converting circuit comprises a field-effected transistor arranged to receive the up-sampling signal, and the adjustable voltage is arranged to adjust a turn-on resistance of the field-effected transistor.

3. The data converting device of claim 1, wherein the voltage level generating circuit comprises:
   a current-based digital-to-analog converter, arranged to generate a current; and
   a field-effected transistor, arranged to generate the adjustable voltage according to the current.

4. The data converting device of claim 1, wherein the signal converting circuit comprises:
   a first field-effected transistor, arranged to generate a first voltage according to the adjustable voltage;
   a second field-effected transistor, having a gate terminal receiving the up-sampling signal, a first connecting terminal receiving the first voltage, and a second connecting terminal outputting a second voltage; and
   a third field-effected transistor, having a gate terminal receiving a tuning voltage, a first connecting terminal receiving the second voltage, and a second connecting terminal outputting the converting signal.

5. The data converting device of claim 1, further comprising:
   an adjusting circuit, arranged to adjust a voltage level of the up-sampling signal to generate an adjusted up-sampling signal according to the adjustable voltage;
   wherein the signal converting circuit is arranged to generate the converting signal according to the adjusted up-sampling signal.

6. The data converting device of claim 5, wherein the adjusting circuit comprises:
   a first pass gate, arranged to output the adjustable voltage to an output terminal when the up-sampling signal is a first voltage level; and
   a second pass gate, arranged to output a reference voltage to the output terminal when the up-sampling signal is a second voltage level different from the first voltage level;
   wherein a signal on the output terminal is the adjusted up-sampling signal.

7. The data converting device of claim 5, wherein the signal converting circuit comprises:
   a first field-effected transistor, having a gate terminal receiving the adjusted up-sampling signal, a first connecting terminal connecting to a reference voltage, and a second connecting terminal outputting a first voltage; and
   a second field-effected transistor, having a gate terminal receiving a tuning voltage, a first connecting terminal receiving the first voltage, and a second connecting terminal outputting the converting signal.

8. A digital transmitting apparatus, comprising:
   a plurality of first data converting devices, arranged to generate a plurality of first converting signals according to a plurality of first digital signals respectively;
   a plurality of second data converting devices, arranged to generate a plurality of second converting signals according to a plurality of second digital signals respectively, and at least one of the plurality of second data converting devices comprising:
      a data sampling circuit, arranged to up-sample a second digital signal to generate an up-sampling signal according to a clock signal;
      a voltage level generating circuit, arranged to generate an adjustable voltage; and
      a signal converting circuit, arranged to generate a second converting signal according to the adjustable voltage and the up-sampling signal; and
   a loading circuit, arranged to generate an output signal according to the plurality of first converting signals and the plurality of second converting signals;
   wherein the plurality of second digital signals are less significant than the plurality of first digital signals.

9. The digital transmitting apparatus of claim 8, wherein the at least one of the plurality of second data converting devices refers the adjustable voltage to control an instant power of the second converting signal corresponding to the up-sampling signal.

10. The digital transmitting apparatus of claim 8, wherein the at least one of the plurality of second data converting devices comprises a field-effected transistor arranged to receive the up-sampling signal, and the adjustable voltage is arranged to adjust a turn-on resistance of the field-effected transistor.

11. The digital transmitting apparatus of claim 8, wherein the voltage level generating circuit comprises:
   a current-based digital-to-analog converter, arranged to generate a current; and
   a field-effected transistor, arranged to generate the adjustable voltage according to the current.

12. The digital transmitting apparatus of claim 8, wherein the at least one of the plurality of second data converting devices comprises:
   a first field-effected transistor, arranged to generate a first voltage according to the adjustable voltage;
   a second field-effected transistor, having a gate terminal receiving the up-sampling signal, a first connecting terminal receiving the first voltage, and a second connecting terminal outputting a second voltage; and
   a third field-effected transistor, having a gate terminal receiving a tuning voltage, a first connecting terminal receiving the second voltage, and a second connecting terminal outputting the second converting signal.

13. The digital transmitting apparatus of claim 8, wherein the at least one of the plurality of second data converting devices further comprises:
an adjusting circuit, arranged to adjust a voltage level of the up-sampling signal to generate an adjusted up-sampling signal according to the adjustable voltage;
wherein the at least one of the plurality of second data converting devices is arranged to generate the second converting signal according to the adjusted up-sampling signal.

14. The digital transmitting apparatus of claim 13, wherein the adjusting circuit comprises:
a first pass gate, arranged to output the adjustable voltage to an output terminal when the up-sampling signal is a first voltage level; and
a second pass gate, arranged to output a reference voltage to the output terminal when the up-sampling signal is a second voltage level different from the first voltage level;
wherein a signal on the output terminal is the adjusted up-sampling signal.

15. The digital transmitting apparatus of claim 13, wherein the at least one of the plurality of second data converting devices comprises:
a first field-effected transistor, having a gate terminal receiving the adjusted up-sampling signal, a first connecting terminal connecting to a reference voltage, and a second connecting terminal outputting a first voltage; and
a second field-effected transistor, having a gate terminal receiving a tuning voltage, a first connecting terminal receiving the first voltage, and a second connecting terminal outputting the second converting signal.

16. A data converting method, comprising:
up-sampling a digital signal to generate an up-sampling signal according to a clock signal;
generating an adjustable voltage, wherein the step of generating the adjustable voltage comprises:
using a current-based digital-to-analog converter to generate a current; and
using a field-effected transistor to generate the adjustable voltage according to the current; and
generating a converting signal according to the adjustable voltage and the up-sampling signal.

17. A data converting method, comprising:
up-sampling a digital signal to generate an up-sampling signal according to a clock signal;
generating an adjustable voltage; and
generating a converting signal according to the adjustable voltage and the up-sampling signal, wherein the step of generating the converting signal according to the adjustable voltage and the up-sampling signal comprises:
using a first field-effected transistor to generate a first voltage according to the adjustable voltage;
using a second field-effected transistor having a gate terminal receiving the up-sampling signal, a first connecting terminal receiving the first voltage, and a second connecting terminal outputting a second voltage; and
using a third field-effected transistor having a gate terminal receiving a tuning voltage, a first connecting terminal receiving the second voltage, and a second connecting terminal outputting the converting signal.

18. A data converting method, comprising:
up-sampling a digital signal to generate an up-sampling signal according to a clock signal;
generating an adjustable voltage;
generating a converting signal according to the adjustable voltage and the up-sampling signal; and
adjusting a voltage level of the up-sampling signal to generate an adjusted up-sampling signal according to the adjustable voltage;
wherein the step of generating the converting signal according to the adjustable voltage and the up-sampling signal comprises:
generating the converting signal according to the adjusted up-sampling signal.

19. A data converting method, comprising:
up-sampling a digital signal to generate an up-sampling signal according to a clock signal;
generating an adjustable voltage;
adjusting a voltage level of the up-sampling signal to generate an adjusted up-sampling signal according to the adjustable voltage; and
generating a converting signal according to the adjustable voltage and the up-sampling signal, wherein the step of generating the converting signal according to the adjustable voltage and the up-sampling signal comprises:
using a first field-effected transistor having a gate terminal receiving the adjusted up-sampling signal, a first connecting terminal connecting to a reference voltage, and a second connecting terminal outputting a first voltage; and
using a second field-effected transistor, having a gate terminal receiving a tuning voltage, a first connecting terminal receiving the first voltage, and a second connecting terminal outputting the converting signal.

* * * * *